United States Patent

Inoue et al.

Patent Number: 6,110,647
Date of Patent: Aug. 29, 2000

[54] METHOD OF MANUFACTURING SEMICONDUCTOR DEVICE

[75] Inventors: Soichi Inoue, Yokohama; Hisashi Kaneko, Fujisawa; Masahiko Hasunuma, Yokohama; Takamasa Usui, Kawasaki, all of Japan; Masami Aoki, Fishkill, N.Y.; Kazuko Yamamoto, Tokyo; Sachiko Kobayashi, Ichikawa, both of Japan

[73] Assignee: Kabushiki Kaisha Toshiba, Kawasaki, Japan

[21] Appl. No.: 09/024,225

[22] Filed: Feb. 17, 1998

[30] Foreign Application Priority Data

Feb. 18, 1997 [JP] Japan ................................ 9-033649

[51] Int. Cl.[7] ................................ G03F 7/00; G03F 9/00
[52] U.S. Cl. ................................ 430/312; 430/5; 430/30; 430/296; 430/394
[58] Field of Search ................................ 430/5, 312, 394, 430/296, 30

[56] References Cited

U.S. PATENT DOCUMENTS

| | | | |
|---|---|---|---|
| 5,308,741 | 5/1994 | Kemp | 430/312 |
| 5,723,233 | 3/1998 | Garza | 430/5 |
| 5,879,843 | 3/1999 | Ueno | 430/22 |

FOREIGN PATENT DOCUMENTS

| | | |
|---|---|---|
| 534463 | 3/1993 | European Pat. Off. . |
| 58-200238 | 11/1983 | Japan . |

OTHER PUBLICATIONS

A. Starikov; Use of a Single Size Square Serif for Variable Print Bias Compensation in Microlithography: Method, Design and Practice; SPIE vol. 1088 Optical/ Laser Microlithography II (1989), pp. 34–46.

*Primary Examiner*—Kathleen Duda
*Assistant Examiner*—Nicole Barreca
*Attorney, Agent, or Firm*—Finnegan, Henderson, Farabow, Garrett & Dunner, LLP

[57] ABSTRACT

A method of manufacturing a semiconductor device, comprises the steps of forming a first transfer pattern corresponding to a mask pattern on a major surface side of a semiconductor substrate through a first mask plate on which the first mask pattern having a straight portion and a bent portion is formed, and forming a second transfer pattern corresponding to a second mask pattern on a major surface side of the semiconductor substrate through a second mask plate on which the second mask pattern having a pattern arranged at a position corresponding to the straight portion is formed.

12 Claims, 3 Drawing Sheets

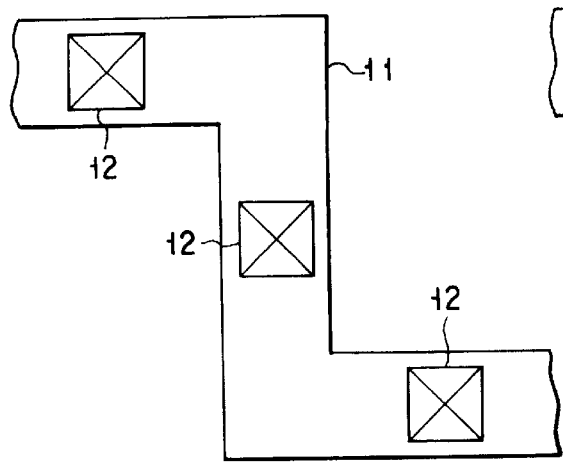
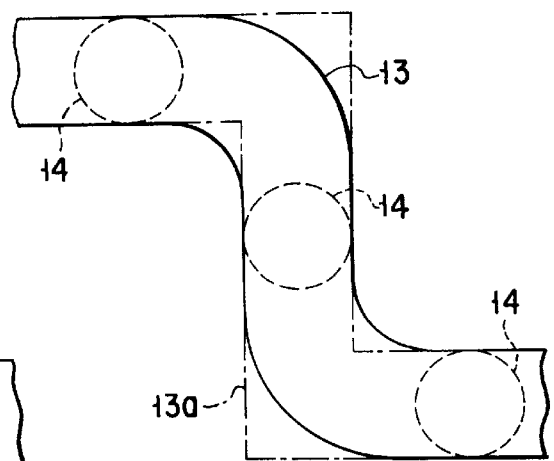
FIG.3A  FIG.3B
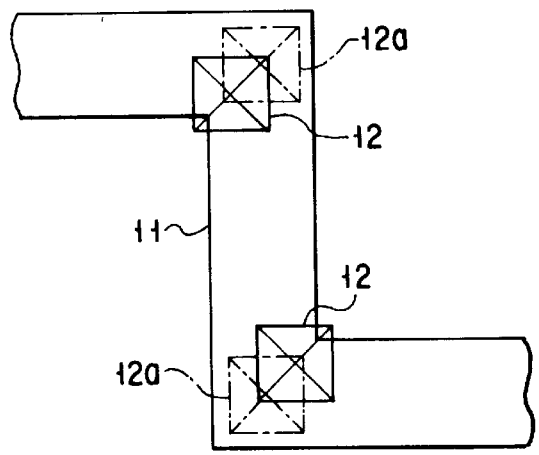
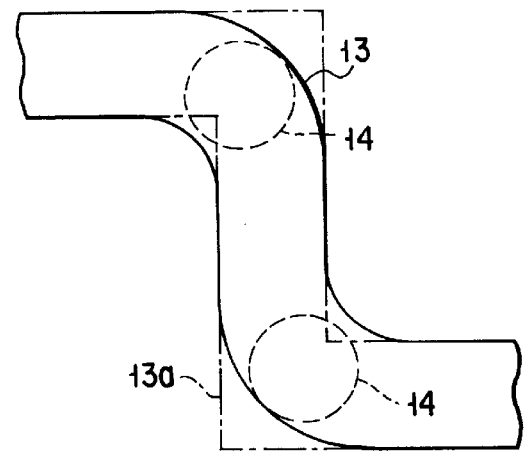
FIG.4A  FIG.4B
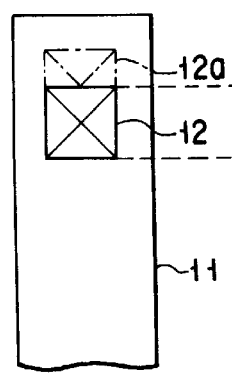
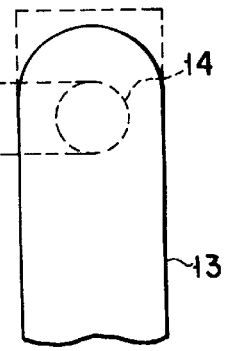
FIG.5A  FIG.5B

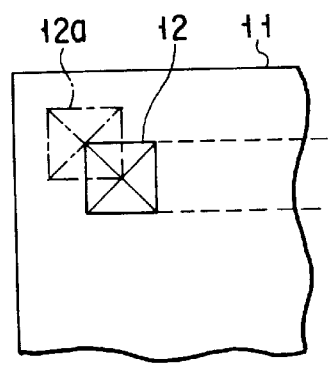 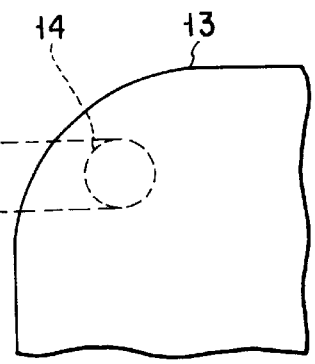
FIG.6A  FIG.6B
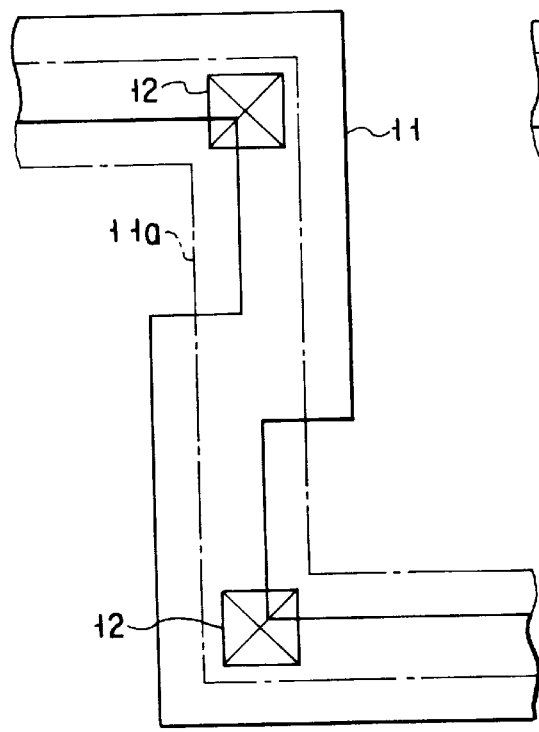 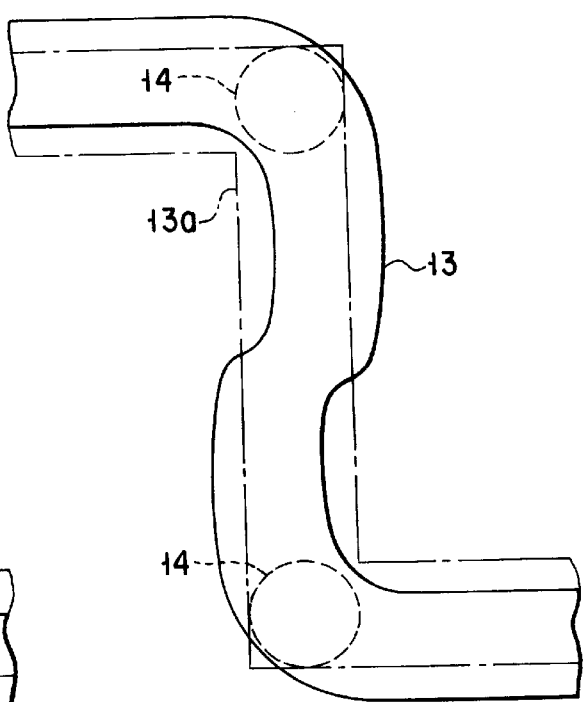
FIG.7A  FIG.7B

METHOD OF MANUFACTURING SEMICONDUCTOR DEVICE

BACKGROUND OF THE INVENTION

The present invention relates to a method of manufacturing a semiconductor device, more particular, to a method of manufacturing a semiconductor device related to alignment of a wiring pattern or the like and a hole pattern.

When the minimum size of an LSI pattern becomes close to a resolution limit in optical lithography, the fidelity of a resist pattern to a mask pattern is degraded, or line width of the resist size becomes abnormal. That is, a so-called optical proximity effect (OPE) becomes conspicuous.

FIGS. 1A and 1B show this optical proximity effect, in which FIG. 1A shows the design (design patterns) of a wiring pattern and a hole pattern (via hole or contact hole) and FIG. 1B shows a pattern on a wafer exposed by using a mask formed on the basis of the design in FIG. 1A.

A wiring pattern 11 has a straight portion and a bent portion, and a hole pattern 12 is generally arranged at the bent portion of the wiring pattern 11. The wiring pattern 11 and the hole pattern 12 are formed on different layers, respectively. A mask is formed according to the wiring pattern 11, and exposure is performed by using this mask to form a wiring pattern 13, as shown in FIG. 1B. Similarly, a mask pattern is formed according to the hole pattern 12, and exposure is performed by using this mask to form a hole pattern 14 on the wafer, as shown in FIG. 1B.

When the wiring pattern and the hole pattern have pattern sizes, which are close to the resolution limit in optical lithography, the optical proximity effect becomes conspicuous, and as shown in FIG. 1B, the corner of the bent portion of the wiring pattern 13 on the wafer has a conspicuous round shape. For this reason, the wiring pattern 13 is transferred to a position offset from an ideal wiring pattern 13a obtained in a state being free from the optical proximity effect. The hole pattern 14 also becomes round at a rectangular corner to obtain a circular pattern. As a result, the wiring pattern 13 is offset from the hole pattern 14 to cause the characteristics, reliability, and the like to be considerably degraded.

FIGS. 2A and 2B show optical proximity correction (OPC) which is developed as a means for solving the above problem. This optical proximity correction is performed to automatically add a fine pattern (serif pattern) which cannot be resolved to a mask. FIG. 2A show the design of a wiring pattern and a hole pattern (a via hole or a contact hole) and FIG. 2B shows a pattern on a wafer exposed by using a mask formed on the basis of the design in FIG. 2A.

According to the method using this optical proximity correction, a serif pattern 15 is formed in correspondence with the bent portion of the wiring pattern 11 such that a pattern desired by a designer is obtained as a pattern formed on a wafer, as shown in FIG. 2A. When the serif pattern 15 is formed as described above, as shown in FIG. 2B, the wiring pattern 13 transferred onto the wafer can be made close to the ideal wiring pattern 13a. As a result, the relative offset between the wiring pattern 13 and the hole pattern 14 can be corrected.

However, by adding the serif pattern 15, the mask data of the wiring pattern 11 considerably increases in comparison with a pattern 11a, which has no serif pattern 15. In addition, a pattern having a size smaller than a general pattern size must be formed on the mask.

As described above, when the wiring pattern or the hole pattern has a pattern size being close to a resolution limit in optical lithography, an optical proximity effect becomes conspicuous. For this reason, the corner of the bent portion of the wiring pattern transferred onto the wafer becomes conspicuously round, and the wiring pattern and the hole pattern are offset from each other, thereby causing the characteristics, reliability, and the like to be considerably degraded. Although a method of forming a serif pattern to solve this problem is also proposed, an amount of mask data becomes great, and a mask forming must receive a lot of load.

BRIEF SUMMARY OF THE INVENTION

It is an object of the present invention to provide a method of manufacturing a semiconductor device in which there is a relative offset between transferred patterns even in a case wherein a pattern is not faithfully transferred due to an optical proximity effect which is conspicuous when a pattern size becomes a size being close to a resolution limit.

A method of manufacturing a semiconductor device according to the first aspect of the present invention comprises the steps of: forming a first transfer pattern corresponding to a mask pattern on a major surface side of a semiconductor substrate through a first mask plate on which the first mask pattern having a straight portion and a bent portion is formed; and forming a second transfer pattern corresponding to a second mask pattern on a major surface side of the semiconductor substrate through a second mask plate on which the second mask pattern having a pattern arranged at a position corresponding to the straight portion is formed.

According to the first aspect of the present invention, since the second transfer pattern (e.g., hole pattern) is arranged at a position corresponding to the straight portion of the first transfer pattern (e.g., wiring pattern) which is not influenced by an optical proximity effect, the first transfer pattern and the second transfer pattern can be prevented from being relatively offset. Therefore, even if a wiring layer is connected to another layer through holes, these layers can be reliably connected to each other, and the characteristics, reliability, and the like of a semiconductor integrated circuit can be prevented from being degraded.

A method of manufacturing a semiconductor device according to the second aspect of the present invention comprises the steps of: designing a semiconductor device; forming a first mask plate on which a first mask pattern is formed; forming a second mask plate on which a second mask pattern is formed; forming a first transfer pattern corresponding to the first mask pattern on a major surface side of a semiconductor substrate through the first mask plate; and forming a second transfer pattern corresponding to the second mask pattern on the major surface side of the semiconductor substrate through the second mask plate, wherein one step of the step of designing the semiconductor device to the step of forming the second mask pattern includes a step of correcting the second mask pattern in accordance with a transfer error of the first transfer pattern to the first mask pattern generated in a region in which the first mask pattern in the step of forming a first transfer pattern is not faithfully transferred. It is preferable the step of correcting the second mask pattern includes the step of correcting a position of the second mask pattern.

According to the second aspect of the present invention, since the position of the second mask pattern (hole pattern) is corrected with respect to a transfer error in advance in one step of the step of designing a semiconductor device to the step of forming a second mask pattern, the first transfer pattern (wiring pattern or the like) and the second transfer pattern (hole pattern) can be reliably prevented from being relatively offset. Therefore, a wiring layer and another layer can be reliably connected to each other through holes, and the characteristics, reliability, and the like of a semiconductor integrated circuit can be prevented from being degraded.

A method of manufacturing a semiconductor device according to the third aspect of the present invention comprises the steps of: designing a semiconductor device; forming a first mask plate on which a first mask pattern is formed; forming a second mask plate on which a second mask pattern is formed; forming a first transfer pattern corresponding to the first mask pattern on a major surface side of a semiconductor substrate through the first mask plate; and forming a second transfer pattern corresponding to the second mask pattern on the major surface side of the semiconductor substrate through the second mask plate, wherein one step of the step of designing a semiconductor device to the step of forming a first mask pattern includes the step of correcting the first mask pattern in accordance with a transfer error of the first transfer pattern to the first mask pattern generated in a region in which the first mask pattern in the step of forming a first transfer pattern is not faithfully transferred.

According to the third aspect of the present invention, since the position of the first mask pattern (e.g., wiring pattern) is corrected in accordance with a transfer error in advance in one step of the step of designing a semiconductor device to the step of forming a first mask pattern, the first transfer pattern (e.g., wiring pattern or the like) and the second transfer pattern (e.g., hole pattern) can be reliably prevented from being relatively offset. Therefore, a wiring layer and another layer can be reliably connected to each other through holes, and the characteristics, reliability, and the like of a semiconductor integrated circuit can be prevented from being degraded.

In the first to third aspects, it is preferable the first mask pattern includes a wiring pattern, and the second mask pattern includes a hole pattern.

In the second to third aspects, preferable embodiments are described as follows.

(1) The step of correcting a first mask pattern is the step of correcting an error caused by a transfer error based on a proximity effect. The proximity effect includes an optical proximity effect.

(2) The first transfer pattern has a straight portion and a bent portion, and the second transfer pattern is arranged at a position corresponding to the bent portion.

The methods of manufacturing semiconductor devices according to the first to third aspects can be independently executed, and the methods may be executed such that these methods are combined to each other.

As described above, according to the present invention, a relative offset between a transferred wiring pattern or the like and a transferred hole pattern caused by an optical proximity effect or the like can be suppressed. Therefore, even if a wiring layer is connected to another layer through holes, the layers can be reliably connected to each other, and the characteristics, reliability, and the like of a semiconductor integrated circuit can be prevented from being degraded.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 3A and 3B are views showing the first embodiment of the present invention;

FIGS. 4A and 4B are views showing the second embodiment of the present invention;

FIGS. 5A and 5B are views showing a modification of the second embodiment;

FIGS. 6A and 6B are views showing another modification of the second embodiment; and FIGS. 7A and 7B are views showing the third embodiment of the present invention.

DETAILED DESCRIPTION OF THE INVENTION

Figure 1A:
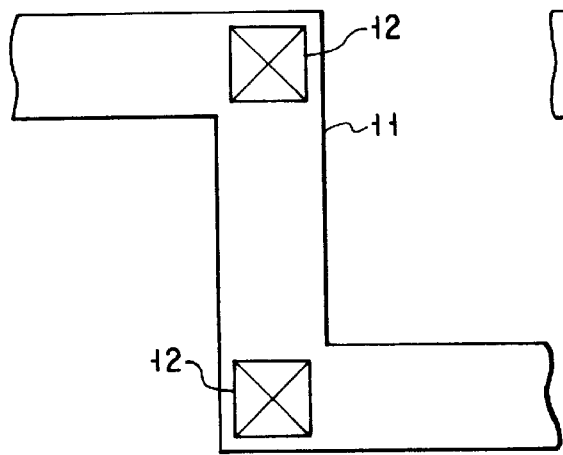
FIGS. 1A and 1B are views showing a prior art.
Figure 1B:
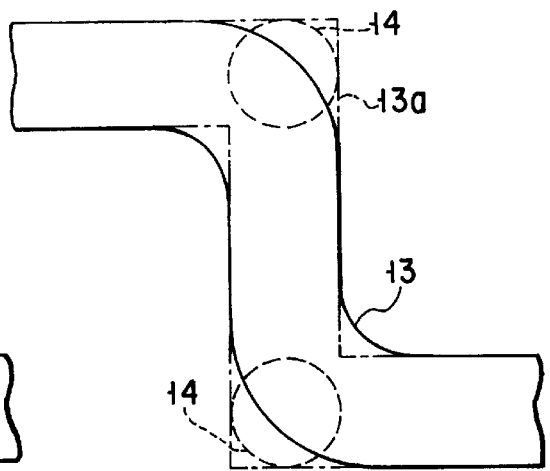
Figure 2A:
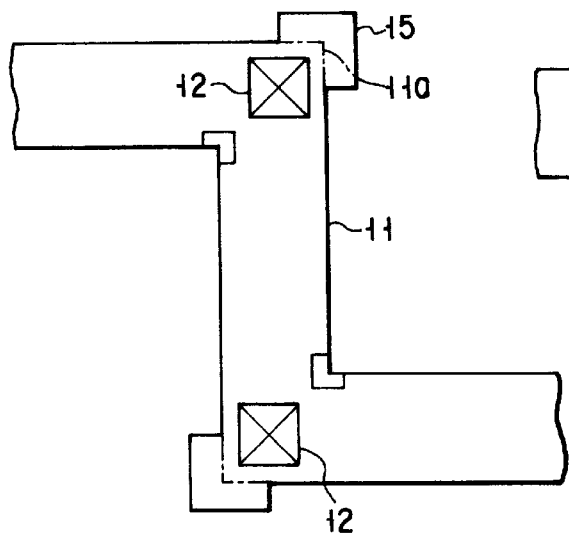
FIGS. 2A and 2B are views showing another prior art.
Figure 2B:
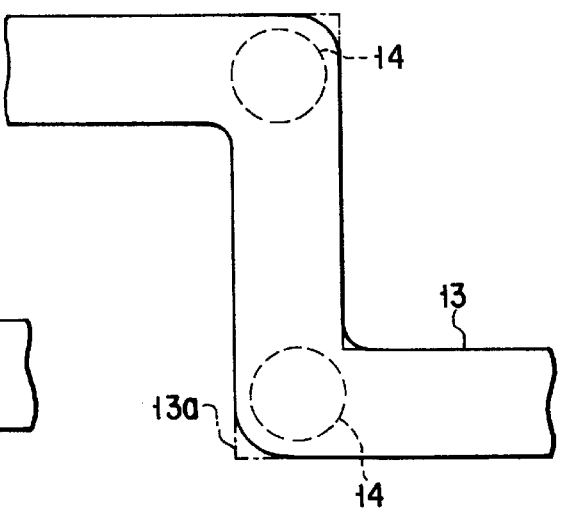

Embodiments of the present invention will be described below with reference to the accompanying drawings.

FIGS. 3A and 3B show the first embodiment according to the invention. FIG. 3A shows the design (design pattern) of a wiring pattern and a hole pattern (via hole or contact hole), and FIG. 3B shows a pattern of a wafer exposed by using a mask formed on the basis of the design in FIG. 3A.

The feature of the first embodiment is that a hole pattern 12 is arranged on the straight portion of a wiring pattern 11.

As shown in FIGS. 3A and 3B, the wiring pattern 11 has a straight portion and a bent portion or corner portion, and the hole pattern 12 is arranged on the straight portion of the wiring pattern 11 as described above. The wiring pattern 11 and the hole pattern 12 are constituted by different layers, respectively.

A mask pattern is formed on a mask plate according to the wiring pattern 11, and exposure (electromagnetic wave or charged particles are irradiated) is performed through this mask pattern, thereby forming a wiring pattern 13 on the wafer as shown in FIG. 3B. Similarly, a mask pattern is formed on a mask plate according to the hole pattern 12, exposure is performed through this mask pattern, thereby forming a hole pattern 14 on the wafer as shown in FIG. 3B.

When the wiring pattern 11 has a pattern size, which is close to a resolution limit in optical lithography, an optical proximity effect becomes conspicuous. For this reason, as shown in FIG. 3B, the corner of the bent portion of the wiring pattern 13 on the wafer becomes conspicuously round. Therefore, the wiring pattern 13 may be transferred to a position offset from an ideal wiring pattern 13a obtained in a state being free from the optical proximity effect. In contrast to this, on the straight portion of the wiring pattern 13, as is apparent from FIG. 3B, the wiring pattern 13 is not offset from the ideal wiring pattern 13a.

In the first embodiment, as shown in FIG. 3A, the hole pattern 12 is designed to be located at the straight portion of the wiring pattern 11. For this reason, as shown in FIG. 3B, the hole pattern 14 is formed on the straight portion of the wiring pattern 13. Since the hole pattern 14 is formed on the straight portion which is not offset from the straight portion of the ideal wiring pattern 13a as described above, the wiring pattern 13 and the hole pattern 14 are not offset from each other. Therefore, according to the first embodiment, since a wiring layer can be reliably connected to another layer (another wiring layer, a diffusion layer, or the like) through holes, the characteristics, reliability, and the like of a semiconductor integrated circuit can be prevented from being degraded.

FIGS. 4A and 4B show the second embodiment of the invention. FIG. 4A is a design (design pattern) of a wiring pattern and a hole pattern (via hole or contact hole) and FIG. 4B shows a pattern on a wafer exposed by using a mask formed on the basis of the design in FIG. 4A. The same reference numerals as in FIGS. 3A and 3B denote the same parts in FIGS. 4A and 4B.

In the second embodiment, a wiring pattern 11 has a straight portion and a bent portion, and a hole pattern 12 is arranged on the bent portion of the wiring pattern 11. The wiring pattern 11 and the hole pattern 12 are constituted by different layers, respectively. A mask pattern is formed on a mask plate according to the wiring pattern 11, and exposure (electromagnetic wave or charged particles are irradiated) is performed through this mask pattern, thereby forming a wiring pattern 13 on the wafer as shown in FIG. 4B. Similarly, a mask pattern is formed on a mask plate according to the hole pattern 12, exposure is performed through this mask pattern, thereby forming a hole pattern 14 on the wafer as shown in FIG. 4B.

As described in the first embodiment, when the wiring pattern 11 has a pattern size, which is close to a resolution limit in optical lithography, an optical proximity effect becomes conspicuous. For this reason, the wiring pattern 13 may be transferred to a position offset from an ideal wiring pattern 13a obtained in a state being free from the optical proximity effect.

In the second embodiment, an amount of offset (transfer error) based on the optical proximity effect described above is predicted, and in any step of the step of designing an LSI to the step of forming a mask, the position of the hole pattern is corrected from a hole pattern 12a into the position of the hole pattern 12 in advance in accordance with the amount of offset. More specifically, the above correction is performed in the data conversion step of converting LSI design data into mask drawing data. As a result, as shown in FIG. 4B, the pattern is transferred on the wafer in a state wherein the offset between the wiring pattern 13 and the hole pattern 14 is corrected. Therefore, a wiring layer can be reliably connected to another layer through holes, the characteristics, reliability, and the like of a semiconductor integrated circuit can be prevented from being degraded.

As described above, a thought that the position of the hole pattern is corrected in advance in any step of the step of designing an LSI to the step of forming a mask can also be applied to the pattern shown in FIGS. 5A and 5B or FIGS. 6A and 6B.

FIGS. 5A and 5B show a state wherein the second embodiment is applied to a pattern end portion. As shown in FIG. 5A (design pattern), a pattern is transferred onto a wafer in a state wherein the offset between the hole patterns 14 is corrected as shown in FIG. 5B (transfer pattern on the wafer) by correcting the position of the hole pattern at the corner portion of the pattern 11 in advance from the hole pattern 12a into the hole pattern 12, even when the pattern 13 is shortened by the optical proximity effect.

FIGS. 6A and 6B show a state wherein the second embodiment is applied to a pattern corner portion. As shown in FIG. 6A (design pattern), a pattern is transferred onto a wafer in a state wherein the offset between the hole patterns 14 is corrected as shown in FIG. 6B (transfer pattern on the wafer) by correcting the position of the hole pattern at the corner portion of the pattern 11 in advance from the hole pattern 12a into the hole pattern 12, even when the corner of the pattern 13 is rounded by the optical proximity effect.

FIGS. 7A and 7B show the third embodiment of the invention. FIG. 7A is a design (design pattern) of a wiring pattern and a hole pattern (via hole or contact hole) and FIG. 7B shows a pattern on a wafer exposed by using a mask formed on the basis of the design in FIG. 7A. The same reference numerals as in FIGS. 3A and 3B denote the same parts in FIGS. 7A and 7B.

A wiring pattern 11 has a straight portion and a bent portion, and a hole pattern 12 is arranged on the bent portion of the wiring pattern 11. The wiring pattern 11 and the hole pattern 12 are constituted by different layers, respectively. A mask pattern is formed on a mask plate according to the wiring pattern 11, and exposure (electromagnetic wave or charged particles are irradiated) is performed through this mask pattern, thereby forming a wiring pattern 13 on the wafer as shown in FIG. 7B. Similarly, a mask pattern is formed on a mask plate according to the hole pattern 12, exposure is performed through this mask pattern, thereby forming a hole pattern 14 on the wafer as shown in FIG. 7B.

As described in the first embodiment or the like, when the wiring pattern 11 has a pattern size, which is close to a resolution limit in optical lithography, an optical proximity effect becomes conspicuous. For this reason, the wiring pattern 13 may be transferred to a position offset from an ideal wiring pattern 13a obtained in a state being free from the optical proximity effect.

In this embodiment, an amount of offset based on the optical proximity effect described above is predicted, and in any step of the step of designing an LSI to the step of forming a mask, the position of the wiring pattern is corrected from a wiring pattern 11a into the position of the wiring pattern 11 in advance in accordance with the amount of offset. More specifically, the above correction is performed in the data conversion step of converting LSI design data into mask drawing data. As a result, as shown in FIG. 7B, the pattern is transferred on the wafer in a state wherein the offset between the wiring pattern 13 and the hole pattern 14 is corrected. Therefore, a wiring layer can be reliably connected to another layer through holes, the characteristics, reliability, and the like of a semiconductor integrated circuit can be prevented from being degraded.

In the examples described in the first to third embodiments, a wiring pattern or the like is formed on the upper layer side of the hole pattern. However, in contrast to this, the wiring pattern or the like may be formed on the lower layer side of the hole pattern.

Although the first to third embodiments have been described as independent embodiments, the first to third embodiments may be applied such that they are combined with each other.

In the embodiments, a case of preventing a transfer error based on a proximity effect caused in an optical effect is described. The invention is not limited to this case. The invention may be applied to prevent a round of a corner of a pattern generated in an etching step or the like.

Various modifications may be effected without departing from the spirit and scope of the present invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, comprising the steps of:

forming a first transfer pattern corresponding to a first mask pattern on a first layer formed on a major surface side of a semiconductor substrate through a first mask plate on which said first mask pattern having a straight portion and a corner portion is formed; and forming a second transfer pattern corresponding to a second mask pattern on a second layer formed above said first layer which is formed on the major surface side of said semiconductor substrate through a second mask plate, wherein said second mask pattern overlaps said straight portion and does not overlap said corner portion and wherein said first mask pattern includes a wiring pattern, and said second mask pattern includes a hole pattern.

2. A method of manufacturing a semiconductor device, comprising the steps of:

designing a semiconductor device;

forming a first mask plate;

forming a first mask pattern on said first mask plate;

predicting a transfer error of a first transfer pattern, corresponding to said first mask pattern, in a region in which said first mask pattern is not accurately transferred;

forming a second mask plate;

designing a second mask pattern compensating for said transfer error;

forming said second mask pattern as designed on said second mask plate;

forming said first transfer pattern corresponding to said first mask pattern on a first layer formed on a major surface side of a semiconductor substrate through said first mask plate; and forming a second transfer pattern corresponding to the second mask pattern on a second layer formed above said first layer, which is formed on the major surface side of said semiconductor substrate, through said second mask plate.

3. A method of manufacturing a semiconductor device according to claim 2, wherein the step of designing said second mask pattern includes the step of shifting a position of said second mask pattern.

4. A method of manufacturing a semiconductor device according to claim 2, wherein said first mask pattern includes a wiring pattern, and said second mask pattern includes a hole pattern.

5. A method of manufacturing a semiconductor device according to claim 2, wherein the step of designing said second mask pattern includes a step of correcting an error caused by a transfer error based on a proximity effect.

6. A method of manufacturing a semiconductor device according to claim 5, wherein said proximity effect includes an optical proximity effect.

7. A method of manufacturing a semiconductor device according to claim 2, wherein said first transfer pattern has a straight portion and a corner portion, and said second transfer pattern is arranged at a position overlapping the corner portion.

8. A method of manufacturing a semiconductor device, comprising the steps of:

designing a semiconductor device;

forming a first mask plate;

designing a first mask pattern to be formed on said first mask plate;

predicting a transfer error of a first transfer pattern, corresponding to the designed first mask pattern, in a region in which said designed first mask pattern is not accurately transferred;

modifying the designed first mask pattern by compensating for said transfer error;

forming said first mask pattern as designed on said first mask plate;

forming a second mask plate;

forming a second mask pattern on said second mask plate;

forming a first transfer pattern corresponding to said first mask pattern on a first layer formed on a major surface side of a semiconductor substrate through said first mask plate; and forming a second transfer pattern corresponding to the second mask pattern on a second layer formed above said first layer, which is formed on the major surface side of said semiconductor substrate, through said second mask plate.

9. A method of manufacturing a semiconductor device according to claim 8, wherein said first mask pattern includes a wiring pattern, and said second mask pattern includes a hole pattern.

10. A method of manufacturing a semiconductor device according to claim 8, wherein the step of designing a first mask pattern includes a step of correcting an error caused by a transfer error based on a proximity effect.

11. A method of manufacturing a semiconductor device according to claim 10, wherein said proximity effect includes an optical proximity effect.

12. A method of manufacturing a semiconductor device according to claim 8, wherein said first transfer pattern has a straight portion and a corner portion, and said second transfer pattern is arranged at a position overlapping the corner portion.

* * * * *

UNITED STATES PATENT AND TRADEMARK OFFICE
CERTIFICATE OF CORRECTION

PATENT NO.      : 6,110,647
DATED           : August 29, 2000
INVENTOR(S)     : Soichi Inoue et al.

It is certified that error appears in the above-identified patent and that said Letters Patent is hereby corrected as shown below:

Column 7,
Line 17, after "first layer", insert a comma -- , --.
Line 21, after "portion", insert a comma -- , --.

Signed and Sealed this

Fourteenth Day of October, 2003

JAMES E. ROGAN
*Director of the United States Patent and Trademark Office*